US008004858B2

(12) United States Patent
Jauert et al.

(10) Patent No.: US 8,004,858 B2
(45) Date of Patent: Aug. 23, 2011

(54) ARRANGEMENT FOR INSTALLING A COMMUNICATION UNIT IN AN APPARATUS

(75) Inventors: Joachim Jauert, Berlin (DE); Axel Ortmann, Berlin (DE); Tilmann Schilling, Berlin (DE); Torsten Schlaaff, Zepernick (DE); Andreas Wagner, Berlin (DE); Dieter Wölm, Gross Schulzandorf (DE)

(73) Assignee: Francotyp-Postalia GmbH (DE)

( * ) Notice: Subject to any disclaimer, the term of this patent is extended or adjusted under 35 U.S.C. 154(b) by 1369 days.

(21) Appl. No.: 11/172,774

(22) Filed: Jul. 1, 2005

(65) Prior Publication Data

US 2006/0010000 A1 Jan. 12, 2006

(30) Foreign Application Priority Data

Jul. 6, 2004 (DE) ..................... 20 2004 010 858 U

(51) Int. Cl.
*H05K 7/14* (2006.01)
*H05K 7/18* (2006.01)

(52) U.S. Cl. ........ 361/799; 361/752; 361/796; 361/730; 361/814

(58) Field of Classification Search .................. 361/799, 361/796, 730, 814
See application file for complete search history.

(56) References Cited

U.S. PATENT DOCUMENTS

| | | | | |
|---|---|---|---|---|
| 4,767,228 | A | 8/1988 | Harry | |
| 5,526,235 | A * | 6/1996 | Beason et al. | 361/799 |
| 5,582,593 | A * | 12/1996 | Hultman | 604/65 |
| 5,600,539 | A | 2/1997 | Heys, Jr. et al. | |
| 5,603,038 | A * | 2/1997 | Crump et al. | 713/310 |
| 5,764,506 | A * | 6/1998 | Eynaud | 700/12 |
| 5,933,330 | A * | 8/1999 | Beutler et al. | 361/814 |
| 6,065,679 | A * | 5/2000 | Levie et al. | 235/462.47 |
| 6,304,458 | B1 * | 10/2001 | Mendolia | 361/814 |
| 6,739,717 | B2 * | 5/2004 | Hetzer et al. | 347/108 |
| 6,942,153 | B1 * | 9/2005 | Yuan et al. | 235/472.01 |
| 2002/0114145 | A1 | 8/2002 | Ruff | |
| 2003/0087540 | A1 | 5/2003 | Dawson et al. | |

FOREIGN PATENT DOCUMENTS

| | | |
|---|---|---|
| DE | 200 20 635 | 4/2001 |
| DE | OS 101 14 529 | 2/2002 |
| DE | 202 11 108 | 2/2003 |
| EP | 0 773 517 | 5/1997 |

* cited by examiner

*Primary Examiner* — Yuriy Semenenko
*Assistant Examiner* — Andargie M Aychillhum
(74) *Attorney, Agent, or Firm* — Schiff Hardin LLP

(57) ABSTRACT

An arrangement for installing a communication unit in an apparatus having a security housing, such as a mail processing apparatus, including a cavity bay located at a non-secure region of the apparatus that is accessible by a cover that is non-destructibly detachable from the security housing. The bay receives a pluggable communication unit that has a connection element connectible by a plug-in movement with a connection element of a motherboard located in the secure region of the apparatus: The cavity has at least one further connection element that is electrically conductively and mechanically connected with a metal chassis part of the apparatus in the security housing. This further connection element protrudes into the cavity and establishes contact with the communication unit for grounding thereof.

8 Claims, 1 Drawing Sheet

ARRANGEMENT FOR INSTALLING A COMMUNICATION UNIT IN AN APPARATUS

BACKGROUND OF THE INVENTION

1. Field of the Invention

The invention concerns an arrangement for installing a communication unit in an apparatus suitable for apparatuses with a security housing that internally contains a secure region and a non-secure region, with the communication unit located in the non-secure region. The communication may be an analog or digital modem, an ISDN unit, wireless LAN unit, UMTS unit, Bluetooth unit or another pluggable communication unit. The apparatus can be a billing franking or mail processing apparatuses or any type of data processing apparatus.

2. Description of the Prior Art

An analog modem is conventionally used in franking machines with security modules. The modem is located either directly on the motherboard or at another location inside the apparatus.

In the franking machine of the type mymail® commercially available from Francotyp-Postalia Beteiligungs AG, both the modem and the security module can be plugged in only with the housing shell opened, and cannot be installed from the outside and connected with the motherboard of the franking machine. When the franking machine is to be opened for modem exchange or repair purposes, breakaway screws and/or plastic parts of the security housing must be destroyed. Moreover, in franking machines and other mail processing apparatuses with a security housing, potted seals can be used as further access protection for microprocessor control and for the energizing leads of the print head. After a repair that requires an opening of the security housing, the breakaway screws of the security housing, the seals and other destroyed plastic parts must be replaced by a service technician.

Other components, such as fans in apparatus housings, are known that can be covered with a door that may be opened by customers. The cover or the door thereby remains undestroyed.

The thermotransfer franking machine T1000 commercially available from Francotyp-Postalia Beteiligungs AG has a thermotransfer print head disposed in the housing for printing a franking imprint and a bay situated at the exterior of the housing for acceptance of an exchangeable ink ribbon cartridge. The bay borders a non-secure region. While the access to the secure region of the printing device is prevented by a security housing, a door leading to the bay can be opened at any time (U.S. Pat. No. 4,767,228).

The franking machine of the type mymail® has an externally accessible battery compartment so that the current supply of the security module can be maintained over a longer time span by an additional external battery (German Utility Model 200 20 635).

An arrangement of a security module in a franking machine is known from the German Utility Model 20211108, wherein the security module and the franking machine are manufactured separately from one another and are combined only at the conclusion of in the franking machine assembly. The security module is disposed in the non-secure region of the franking machine and is protected from unauthorized access by means of a non-destructive, detachable flap. The mounting incurs only slight production costs.

There is a continuous growth of the transfer rate requirements for modems used in franking machines. A modem is special data transfer device for telephone networks. Conventionally, only a predetermined modem type coupled to a specific interface of the apparatus is used. In the case of repair or when changes are necessary, for example to increase the data transfer rate, conventionally an intrusion into the franking machine is required in order to access the motherboard with the modem situated inside the security housing. Some franking machine variants are preconfigured at the manufacturer so as to be capable of also being connected with a data center in the future via a predetermined different modem type. A method and arrangement for automatic modem type detection and adaptation is known from European Application 773 517. An external modem that matches the franking machine and the country-specific telephone system can be ordered as an auxiliary part through the franking machine manufacturer. The internal modem then is deactivated but in most cases is not de-installed, but rather remains in situ. An external modem is merely connected and used instead. Under the circumstances, however, it is more susceptible to failure and repair due to environment influences in comparison with an internal modem, which is protected by the fact that it is integrated in the apparatus. In addition to lower acquisition costs, this protects the functionality of the modem without any further measures.

In the future communication units with still higher data transfer rates will be available that will allow larger data quantities to be transmitted cost-effectively. Retrofitting an apparatus with an arbitrary external communication unit would require a country-specific adaptation and initialization at the customer. Moreover, customers cannot be required to manually effect all the settings that would be necessary in connection with a retrofitting of a franking machine with an arbitrary external communication unit after it has been coupled with the existing interface.

Moreover, when the need or desire of such a retrofit occurs, it would not be acceptable to the customer if communication unit cannot simply be exchanged, but rather a technician service must be called because the housing cannot be non-destructively opened.

SUMMARY OF THE INVENTION

An object of the invention is to allow the use of various types or models of communication components that differ with regard to transfer speed, digital or analog operating mode and other parameters, in an apparatus by achieving a simple exchange of the communication unit, without opening the security housing by a service technician being necessary, or access to the inner security region being accessed.

In general, an object of the invention is to provide a protected arrangement of a communication unit in an apparatus with easy installation capability. A further object is to achieve a simple contacting and reliable grounding.

These objects are is achieved according to the claim invention by providing the portion of the apparatus housing that covers a non-secure region of the apparatus with a bay-shaped cavity that is accessible under a cover that is non-destructively detachable from the security housing, the bay-shaped cavity being molded to contain to the pluggable communication unit in terms of shape and size. The communication unit has a first connection element and can be connected by a plug-in movement with a second connection element of a motherboard in the secure region of the apparatus. As an alternative, printed circuit board tracks (pcb tracks) (for example at the edge of the motherboard) can establish direct contact with the communication unit upon insertion, i.e. when the communication unit is guided into the cavity. The cavity has at least one further connection element that is electrically-conductively and mechanically connected with a metal chassis part of the apparatus, this at least one further connection element protruding into the cavity and establishing contact with the communication unit for grounding thereof.

For franking machines, the communication unit is a modem that is arranged in the non-secure region of the franking machine housing. At least one secure region (not visible) and at least one non-secure region (visible given an opened flap) with a bay-shaped cavity are located within the franking machine housing, with the non-secure region being accessible via at least one opening in the housing. The communication unit has a first connection element in the plug-in direction for connection with the motherboard. A standard communication component is mounted on a carrier board that is fashioned such that it can be plugged into the bay-shaped cavity by means of connection elements within the franking machine housing, but outside of the inner secure region of the franking machine. The communication unit is adapted to the communication component and has a structural design such that the communication unit can be inserted into the bay at any time as needed by the customer, via the opening in the franking machine housing and connected by a plug-in movement with a motherboard located in the secure region of the franking machine.

The communication unit has a network connection socket for connection to a communication network at a side facing away from the back wall of the apparatus and orthogonal to the plug-in direction. The communication unit is fashioned in shape and size corresponding to the bay-shaped cavity. The communication unit has a carrier circuit board that adapts the communication component to the first connection element and enables simple contacting via the first connection element and grounding without a cable via at least one screw or nut and a bolt that is electrically-conductively and mechanically connected with a metal chassis part of the apparatus. The bolt may have inner or outer threading.

DESCRIPTION OF THE PREFERRED EMBODIMENTS

Figure 1:
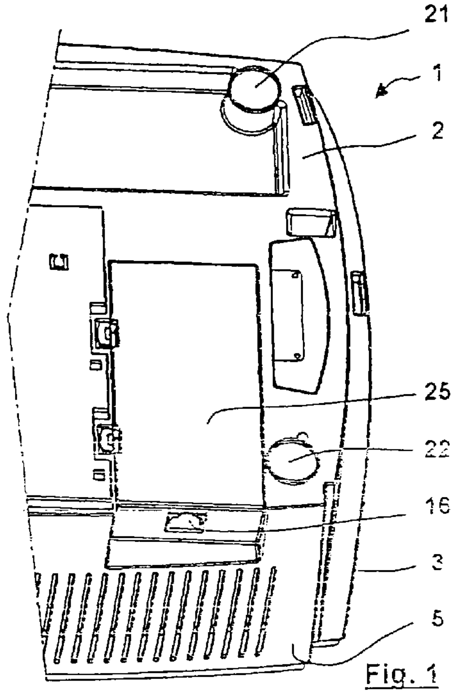
FIG. 1 is a perspective view of a portion of the bottom shell of a franking machine as seen from below the franking machine, with a bay for a communication unit closed by a flap.

FIG. 1 shows a perspective view of a portion of the bottom shell of a franking machine 1 from below, with the back side 5, right side 3 and base 2 with a bay that is closed by a non-destructively-detachable flap 25. The bay incorporated into the base 2 with the detachable flap 25 has an opening for a network connection jack on a side facing away from the back wall. The network connection jack 16 is oriented orthogonally to the plug-in direction of a communication unit that is received in the bay.

Figure 2:
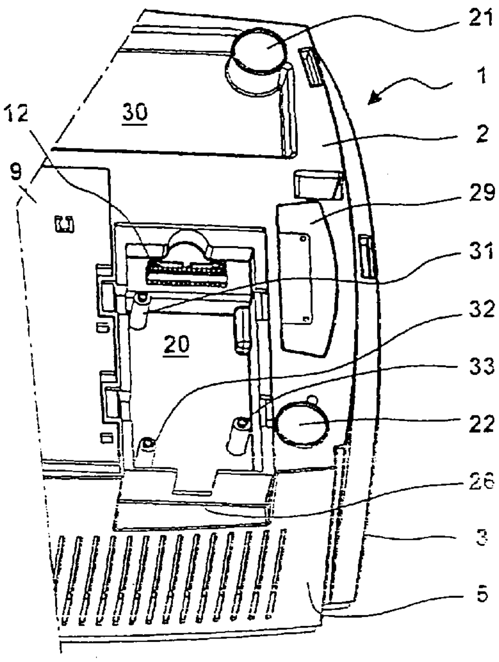
FIG. 2 is the same perspective view as in FIG. 1, with the bay open with no communication unit therein.

FIG. 2 shows the same view an open bay, but without communication unit therein. The bottom shell of the franking machine 1 has a flat base 2 with at least one molded cavity. A bay 20 molded into the base 2 of the bottom shell for a communication unit is shown on the back side 5 and right side 3 of the flat base 2 and a further open bay 30 molded into the base 2 of the bottom shell is shown near the front side and right side 3 of the flat base 2. The bottom shell of the franking machine 1 stands on feet 21 through 24 (see FIG. 2). A first foot 21 is integrally molded on the base of the further bay 30 near the front side and the right side 3. A second foot 22 near the back side 5 and the right side 3 is integrally molded directly on the flat floor 2. At least further feet 23, 24 (shown in FIG. 3) are provided near a left side 4. The bay 20 has an opening 26 that is molded on the back side of the bottom shell and suitable to accommodate a network connection jack of the communication unit.

The bay 20 internally has connection elements for contacting of the communication unit. The communication unit has at least one first connection element 11 (see FIG. 5). The bay 20 internally has a second connection element 12 and third connection elements 31, 32, 33. For example, three stand off bolts are used as the third connection elements 31, 32 and 33 and an edge connector is used as the second connection element 12. The stand off bolts are manufactured from metal and are mounted on a chassis (not externally visible) of the apparatus. They produce a mechanical fastening and an electrical grounding of the communication unit with the chassis. The edge connector effects an electrical connection of the communication unit with the motherboard. A security cover 9 seals a further cavity in the base 2 that is provided for a security module. A further security cover 29 is provided for covering the housing lock. The security covers 9 and 29 are plastic parts serving for access protection that allow access only if the cover 9 or 29 is destroyed.

Figure 3:
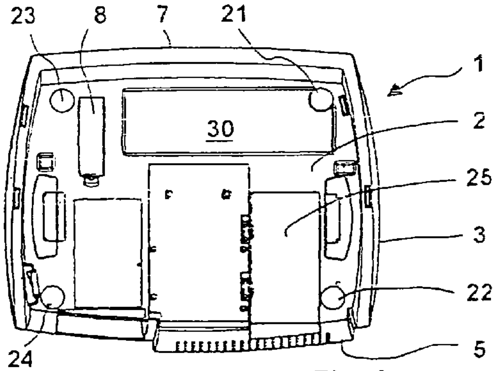
FIG. 3 is a complete view of the franking machine from below.

FIG. 3 shows a view of the franking machine 1 from below. All four feet 21, 22, 23 and 24 can be seen, as well as the non-destructively-detachable flap 25 for the bay 20 on the back side 5, near the right side wall. A further bay closed by a further non-destructively-detachable flap or cover 8 serves as is known as a battery bay. The battery bay is arranged between the left side 3 and the further bay 30 molded into the base 2 of the bottom shell, near the front side and right side 3 of the flat base 2. The covers 8 and 25 and the housing shell in which the cavities are molded are produced from plastic.

The easy mounting capability by plugging-in the communication unit allows the customer to mount it (for example a modem, ISDN card or the like) at any point in time. Location changes and technical advancements thus can be more flexibly reacted to. The same flap 25 can be reattached by the customer after mounting the communication unit.

A microprocessor on the motherboard is programmed such that a (modem) type detection and adaptation to the respective communication network automatically ensues upon selection of the office site of the apparatus, such that the modem or the ISDN card or another communication unit becomes initialized. Country-specific telephone systems exhibit normal technical peculiarities that are to be taken into account before a data transfer can occur. The franking machine manufacturer stores or pre-installs appropriate routine in the program memory of the apparatus so that the installation can proceed semi- or fully-automatically. The franking machine manufacturer provides appropriate written instructions together with the communication unit. All further necessary changes and adjustments can, if applicable, ensue via the user interface of the franking machine.

Figure 4:
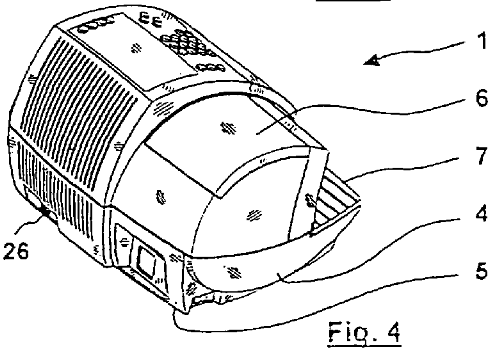
FIG. 4 is a perspective view of the back side, left side and top side of the franking machine.

A perspective view of the back side 5, left side 4 and top side 6 of a franking machine 1 is shown in FIG. 4. The opening 26 on the back side 5 provides access for connection of the communication unit. The associated cavity is arranged in the lower housing shell of the security housing. Alternatively the associated cavity can be arranged (in a manner not shown) in any of the two housing shells of the security housing. A letter feed ensues on the front side 7 of the franking machine 1 from the left side 4 to the right side.

Figure 5:
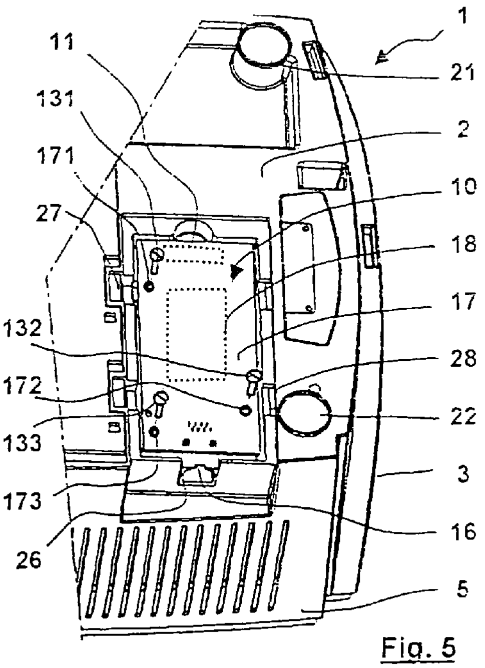
FIG. 5 is the same perspective view as in FIGS. 1 and 2, with a communication unit plugged into the open bay.

FIG. 5 shows a partial perspective view of the bottom-shell of the franking machine 1 from below with the back side, right side and floor with a communication unit 10 plugged into the open bay. The open bay forms a cavity in the lower housing shell of the security housing of the franking machine 1. It is therefore advantageous when the bottom-shell is produced from plastic with the sides 3, 5 and with the feet 21, 22 on the base 2, the cover mounting 27, 28 molded into the base 2 and further (not shown) parts of the security housing. In contrast to this, the screws 131, 132, 1333 are manufactured from a good conductive material, preferably metal. Corresponding drill holes 171, 172, 173 for centering, fastening and contacting are incorporated into the carrier circuit board 17 for the screws, whereby the drill holes 171, 172, 173 are metallized or have a nearby metal conductor layer in the boundary region. Via the screws 131, 132, 133 or other comparable contacting and fastening elements, fastening and grounding of the carrier circuit board 17 ensues by pressing its metal conductor layer against the stand off bolts or another comparable third connection elements that are electrically-conductively and mechanically connected with a metal chassis of the apparatus. A conventional communication component 18 is fashioned such that it can be mounted (plugged-in or soldered) and fastened onto the non-visible side of the carrier circuit board 17 and contacted with the applied pcb tracks that adapt and contact the component to the first connection element (female multipoint connector) 11 as well as, if applicable, connect the component to the network connection jack 16 of the communication unit 10. For the latter purpose, the bay-shaped cavity on the back side 5 of the lower housing shell has an opening 26. The first connection element 11 of the pluggable communication unit 10 is designed such that it can be connected with a second connection element 12 of the motherboard (not visible) in the secure region of the franking machine 1. The communication component 18 mountable on the carrier circuit board 17 can be any suitable communication components selected from among communication components available with various embodiments and different data transfer rates. Depending on location conditions, a matching component can be used as the communication component 18. In principle an analog or digital modem, an ISDN unit, wireless LAN unit, UMTS unit, Bluetooth unit or another pluggable communication unit 8 can be manufactured and used. If, for example, a modem is plugged into the cavity of the lower housing shell, this directly connects with the motherboard upon being plugged in. It is centered and attached on three bolts that simultaneously ensure grounding to a base plate of the franking machine chassis.

Although modifications and changes may be suggested by those skilled in the art, it is the intention of the inventors to embody within the patent warranted hereon all changes and modifications as reasonably and properly come within the scope of their contribution to the art.

We claim as our invention:

1. An electronic apparatus comprising:

an apparatus housing:

a security housing inside apparatus housing, said security housing comprising a secure region, containing components therein requiring protection against tampering, and a non-secure region;

said secure region of said security housing comprising a mechanically tamperproof structure inside of which said components are contained, said mechanically tamperproof structure forming a physical barrier to access of said region that requires mechanical destruction of said mechanically tamperproof structure in order to gain physical access to said secure region in order to remove any of said components therein;

said non-secure region of said security housing being mechanically, non-destructively physically accessible;

a grounded metal chassis contained in said secure region of said security housing;

said components in said secure region including a motherboard comprising operating circuitry for the electronic apparatus;

a communication unit containing communication circuitry and having a connection element that plugs said communication unit to said motherboard to connect said operating circuitry with said communication circuitry;

said non-secure region of said security housing comprising a cavity bay having a size and shape that receives said communication unit, said communication unit being plugged to said motherboard when received in said bay;

a cover closing said bay, said cover being non-destructively detachable from said security housing, said size and shape of said bay, when said cover is detached from said security housing, being configured to allow unimpeded insertion of said communication unit into said bay and unimpeded removal of said communication unit from said bay; and at least one further connection element projecting into said cavity bay and being in contact with said communication unit when said communication unit is in said cavity bay, said further connection element being electrically conductively and mechanically connected to said chassis to ground said communication unit through the chassis and hold said communication unit in said bay.

2. An electronic apparatus as claimed in claim 1 wherein said security housing comprises a housing shell, and wherein said bay is disposed at an exterior of said housing shell.

3. An electronic apparatus as claimed in claim 2 wherein said housing shell comprises a lower housing shell of a franking machine.

4. An electronic apparatus as claimed in claim 1 wherein said connection element of said communication unit is a first connection unit, and comprising a plurality of further connection elements including a second connection element of said motherboard, and wherein said communication unit comprises a carrier circuit board with a communication component mounted thereon, said first connection element being disposed on said carrier circuit board and being plugged into said second connection element when said communication unit is received in said bay, said plurality of further connection elements also comprising at least one third connection element disposed in said bay, and electrically and mechanically connected to said chassis, and wherein said carrier circuit board comprises at least one contacting and fastening element, mating with said at least one third connection element to ground said carrier circuit board to said chassis.

5. An electronic apparatus as claimed in claim 4 wherein said carrier circuit board has a drill hole therein through which said at least one connecting and fastening element proceeds for mating with said at least one third connection element, said at least one third connection element comprising a bolt with interior threading.

6. An electronic apparatus as claimed in claim 4 wherein said carrier circuit board has a drill hole therein through which said at least one connecting and fastening element proceeds for mating with said at least one third connection element, said at least one third connection element comprising a bolt with exterior threading.

7. An electronic apparatus as claimed in claim 1 wherein said security housing comprises a housing shell, and wherein said cover and said housing shell are formed of plastic.

8. An electronic apparatus as claimed in claim 1 wherein said communication unit is a unit selected from the group consisting of an analog modem, a digital modem, an ISDN unit, a wireless LAN unit, a UNTS unit, and a Bluetooth unit.

* * * * *